United States Patent
Kothari et al.

(10) Patent No.: US 11,889,650 B2
(45) Date of Patent: Jan. 30, 2024

(54) INTEGRATED DIRECT MOUNT BRANCH PROTECTION FOR VARIABLE FREQUENCY DRIVE

(71) Applicant: Eaton Intelligent Power Limited, Dublin (IE)

(72) Inventors: Mayur Kothari, Pune (IN); Sudershan Gawali, Pune (IN); Aniket Patil, Pune (IN)

(73) Assignee: Eaton Intelligent Power Limited, Dublin (IE)

( * ) Notice: Subject to any disclaimer, the term of this patent is extended or adjusted under 35 U.S.C. 154(b) by 152 days.

(21) Appl. No.: 17/250,624

(22) PCT Filed: Aug. 14, 2019

(86) PCT No.: PCT/EP2019/025272
§ 371 (c)(1),
(2) Date: Feb. 12, 2021

(87) PCT Pub. No.: WO2020/038604
PCT Pub. Date: Feb. 27, 2020

(65) Prior Publication Data
US 2021/0168960 A1  Jun. 3, 2021

Related U.S. Application Data

(60) Provisional application No. 62/720,505, filed on Aug. 21, 2018.

(51) Int. Cl.
*H02B 1/04* (2006.01)
*H05K 7/14* (2006.01)
(Continued)

(52) U.S. Cl.
CPC ............ *H05K 7/1432* (2013.01); *H02B 1/04* (2013.01); *H02M 7/003* (2013.01); *H05K 5/0021* (2013.01)

(58) Field of Classification Search
None
See application file for complete search history.

(56) References Cited

U.S. PATENT DOCUMENTS 9,485,889 B2 * 11/2016 Broussard .......... H05K 7/20927
9,515,463 B2 * 12/2016 Krause ................... H02B 11/26
(Continued)

FOREIGN PATENT DOCUMENTS

| CN | 201218927 Y | 4/2009 |
| CN | 101507070 A | 8/2009 |

(Continued)

OTHER PUBLICATIONS

Office Action, counterpart Chinese Patent Application No. 201980056986.5, dated Feb. 21, 2022, 27 pages total (including English translation of 17 pages).
(Continued)

*Primary Examiner* — Courtney L Smith
(74) *Attorney, Agent, or Firm* — DiBerardino McGovern IP Group LLC

(57) ABSTRACT

An integrated power protection and conditioning system is disclosed. The integrated power protection and conditioning system includes a variable frequency drive (VFD) having a VFD housing and a power conversion circuit contained within the VFD housing and operable to provide a controlled output power to a load. The integrated power protection and conditioning system also includes a branch protection device having a branch protection housing and a power protection circuit contained within the outer housing and operable to selectively interrupt current flow from a power source to the VFD during a fault condition. The branch protection device is coupled to the VFD, such that the branch protection device is integrated with the VFD.

19 Claims, 6 Drawing Sheets

(51) Int. Cl.
*H02M 7/00* (2006.01)
*H05K 5/00* (2006.01)

(56) References Cited

U.S. PATENT DOCUMENTS

| | | | |
|---|---|---|---|
| 10,177,544 B2* | 1/2019 | Benke | G06F 1/16 |
| 10,601,204 B2* | 3/2020 | Bellows | H05K 5/0247 |
| 2005/0189889 A1 | 9/2005 | Wirtz et al. | |
| 2006/0063434 A1* | 3/2006 | Bergmann | H05K 7/1454 |
| | | | 439/638 |
| 2006/0067018 A1* | 3/2006 | Malkowski, Jr. | H01R 25/142 |
| | | | 361/2 |
| 2008/0081516 A1* | 4/2008 | Brandt | H02B 13/025 |
| | | | 439/638 |
| 2008/0084673 A1 | 4/2008 | Hsiung | |
| 2009/0091877 A1 | 4/2009 | Pispa | |
| 2012/0019987 A1 | 1/2012 | Barreau et al. | |
| 2015/0382492 A1 | 12/2015 | Oneufer et al. | |
| 2016/0013601 A1* | 1/2016 | El Zakhem | H02B 1/16 |
| | | | 439/94 |
| 2016/0204689 A1* | 7/2016 | Wennerstrom | H02M 1/126 |
| | | | 318/400.26 |
| 2019/0190240 A1* | 6/2019 | Kroushl | H02B 1/46 |
| 2020/0303908 A1* | 9/2020 | Oneufer | H02B 1/36 |

FOREIGN PATENT DOCUMENTS

| | | |
|---|---|---|
| CN | 201682592 | 12/2010 |
| CN | 102356704 A | 2/2012 |

OTHER PUBLICATIONS

Grzegorz Galary, European International Searching Authority, International Search Report and Written Opinion, counterpart PCT Application No. PCT/EP2019/025272 dated Dec. 3, 2019, 10 pages total.

Office Action and Search Report, counterpart Chinese Patent Application No. 201980056986.5, dated Dec. 19, 2022, 26 pages total (including English translation of 16 pages).

Office Action, counterpart Chinese Patent Application No. 201980056986.5, dated Apr. 20, 2023, 28 pages total (including English translation of 16 pages).

Decision on Rejection, counterpart Chinese Patent Application No. 201980056986.5, dated Sep. 19, 2023, 40 pages total (including English translation of 22 pages).

* cited by examiner

INTEGRATED DIRECT MOUNT BRANCH PROTECTION FOR VARIABLE FREQUENCY DRIVE

BACKGROUND OF THE INVENTION

Embodiments of the invention relate generally to variable frequency drives and, more particularly, to a variable frequency drive having a branch protection device directly mounted thereto, so as to provide integrated direct mount branch protection for the variable frequency drive.

One type of system commonly used in industry that performs power conversion is an adjustable speed drive, also known as a variable frequency drive (VFD). A VFD is an industrial control device that provides for variable frequency, variable voltage operation of a driven system, such as an AC induction motor. In use, a VFD is often provided as part of a motor control system and overall control and protection assembly that includes the VFD as well as an arrangement of input/output fuses, disconnects, circuit breakers or other protection devices, controllers, filters, sensors, and a bypass assembly that includes one or more of a bypass contactor and soft starter that provide alternate control paths or mechanisms for controlling the driven system.

In a common configuration, the VFD and associated branch protection devices are provided as discrete components having their own housings. The discrete, housed components are then each separately mounted to a common, fixed metal back panel that, in turn, may be mounted to a wall. While such an arrangement and mounting of the VFD and associated branch protection devices provides for a workable motor control system, it is recognized that there are drawbacks associated therewith regarding the overall size/footprint of the system, the number of mounting brackets and fasteners required for such mounting, and the cost of the arrangement due to the requirement of the separate back panel.

It would therefore be desirable to provide a VFD and associated branch protection device integrated therewith that provides a reduced size/footprint of the overall arrangement and that minimizes the number of mounting brackets and fasteners required for mounting the devices. It would further be desirable for the VFD and integrated branch protection device to be cost competitive with existing systems/arrangements and be easy to assemble and install.

BRIEF DESCRIPTION OF THE INVENTION

In accordance with one aspect of the invention, a power protection and conditioning arrangement includes a VFD having a VFD housing and a power conversion circuit contained within the VFD housing and operable to provide a controlled output power to a load. The power protection and conditioning arrangement also includes a branch protection device having a branch protection housing and a power protection circuit contained within the outer housing and operable to selectively interrupt current flow from a power source to the VFD during a fault condition. The branch protection device is coupled to the VFD, such that the branch protection device is integrated with the VFD.

In accordance with another aspect of the invention, an integrated power protection and conditioning system includes a VFD operable to provide a controlled output power to a load and a branch protection device operable to selectively interrupt current flow from a power source to the VFD during a fault condition, wherein a branch protection box of the branch protection device is mounted directly to a housing of the VFD to integrate the branch protection device with the VFD.

In accordance with yet another aspect of the invention, a method for providing an integrated power protection and conditioning system includes providing a branch protection device comprising a branch protection box enclosing branch protection circuitry operable to selectively interrupt current flow and mounting the branch protection device to a VFD comprising a housing enclosing power conversion circuitry operable to provide a controlled output power to a load, wherein mounting the branch protection device to the VFD comprises coupling the branch protection box to the housing, such that the branch protection device is integrated with the VFD.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention relate to providing integrated direct mount branch protection for a variable frequency drive. A branch protection device is mounted directly to a VFD without the requirement of a separate, common fixed metal back panel. The integrated branch protection device and VFD thus provides a compact unit with a reduced number of mounting components and fasteners that is cost competitive and easy to assemble and install.

While embodiments of the invention are described here below as being directed to a VFD with an integrated branch protection device, it is recognized that embodiments of the invention are not meant to be limited to such circuits. That is, embodiments of the invention may be extended more generally to power/energy conversion circuits of varying constructions and implementations, including motor starters, motor control centers, and power/energy conversion circuits for driving non-motor loads, for example. Accordingly, the following discussion of a VFD with an integrated branch protection device is not meant to limit the scope of the invention.

Figure 1:
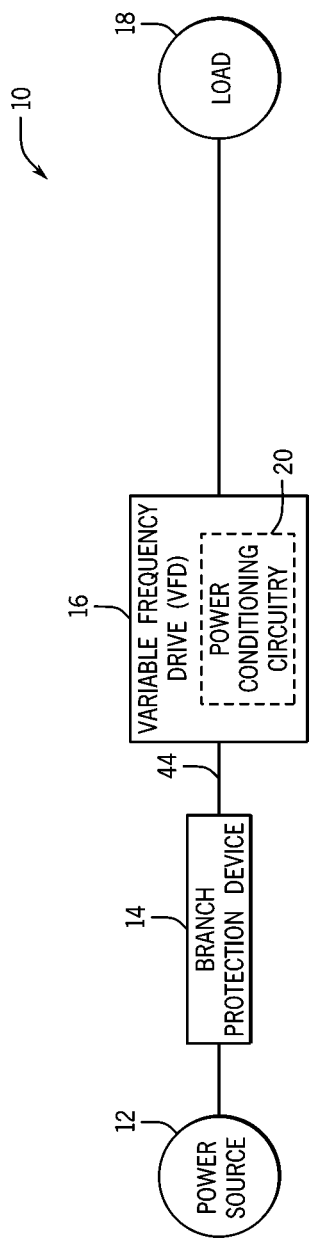
FIG. 1 is a schematic diagram of a power system.

Referring to FIG. 1, a schematic diagram of a power system 10 is illustrated. Power system 10 includes a power source 12, such as from a utility, for example, coupled to a branch protection device 14 that may be operated so as to selectively allow or block a flow of power therethrough. According to embodiments of the invention, branch protection device 14 may be in the form of a disconnect contactor or switch that may be operated in a closed or On position in which power from source 12 is allowed to flow therethrough and an open or Off position in which power may not flow therethrough, or in the form of a circuit breaker that provides overcurrent protection by interrupting the current from power source 12 if the level of current becomes too high.

Branch protection device 14 is coupled to a VFD 16 that operates to provide a controlled output power to a load 18 (e.g., motor). As known in the art, VFD 16 includes power control circuitry 20 therein, such as an arrangement of solid state switches, e.g., IGBTs, that may be controlled via an associated control system or controller (not shown) operably coupled thereto in order to provide a controlled output from the power converter 16. The operation of VFD unit 16 enables driving and adjusting the operating speed of load/motor 18, which can be used to drive fans, conveyors, pumps, or other electromechanical devices.

Referring now to FIGS. 2-6, a power protection and conditioning arrangement formed by the branch protection device 14 and VFD 16 is illustrated, as well as a mounting bracket for mounting the branch protection device 14 directly to the VFD 16. Various perspective views of the power protection and conditioning arrangement are shown to better illustrate a construction of the components and the integration of the components according to an exemplary embodiment of the invention. As will be explained in greater detail below, branch protection device 14 is mounted directly to a VFD 16 without the requirement of a separate, common fixed metal back panel. The integrated branch protection device 14 and VFD 16 thus provides a compact unit with a reduced number of mounting components and fasteners that is cost competitive and easy to assemble and install.

Figure 2:
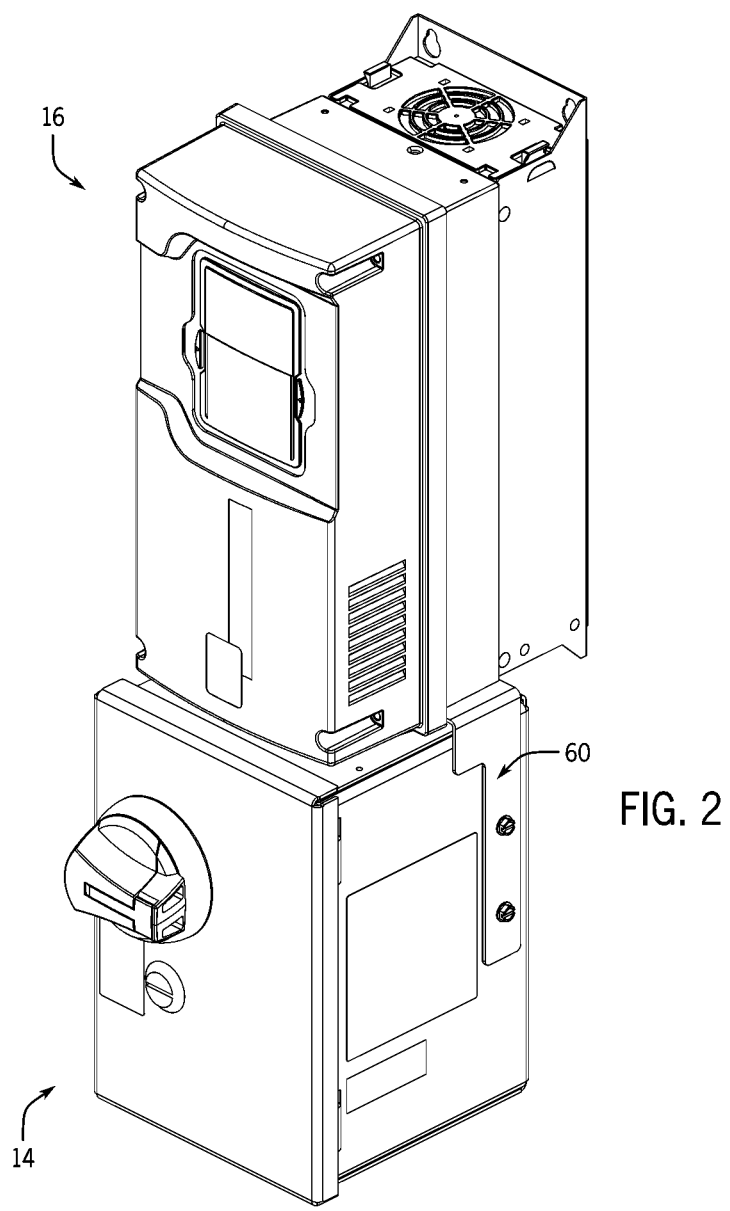
FIG. 2 is a perspective view of a variable frequency drive and integrated branch protection device of the power system of FIG. 1, with the branch protection device being integrated with the VFD, according to an embodiment of the invention.
Figure 3:
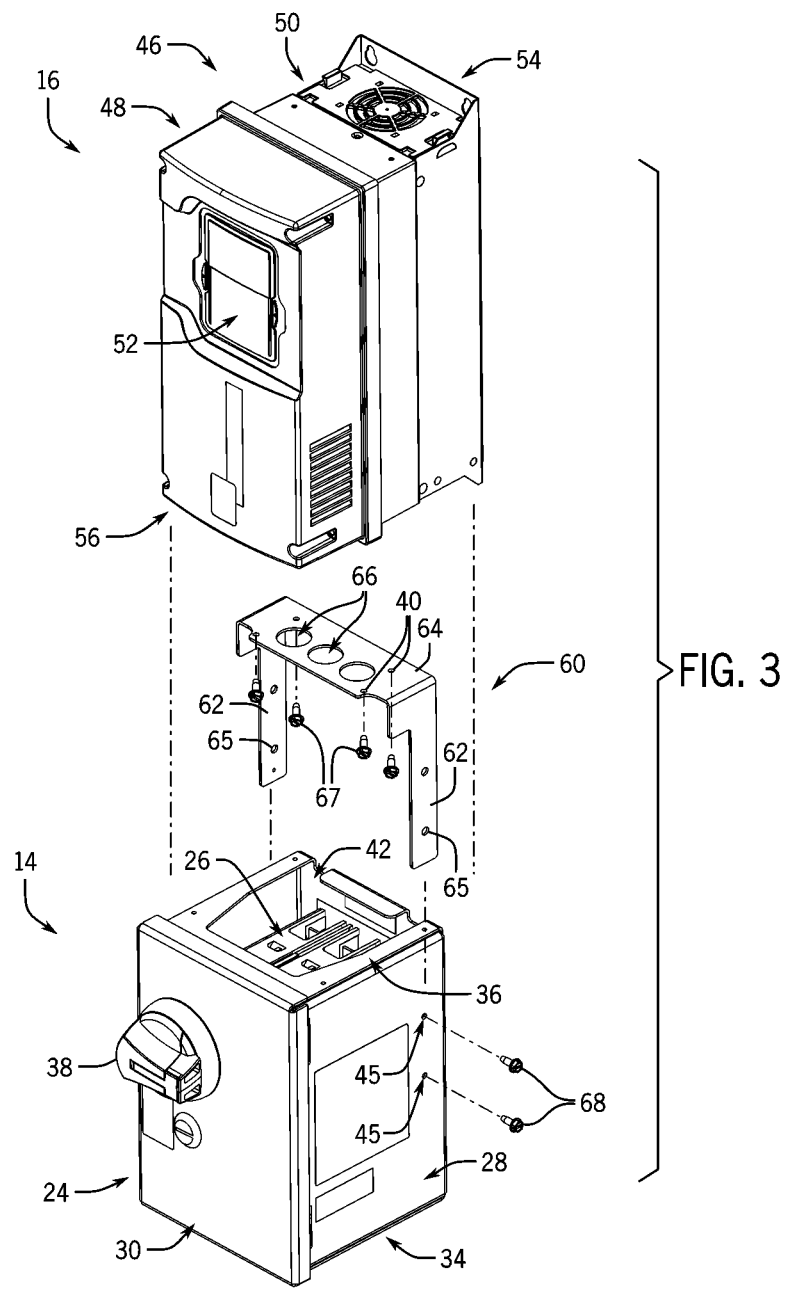
FIG. 3 is an exploded perspective view of the variable frequency drive and integrated branch protection device of FIG. 2.
Figure 4:
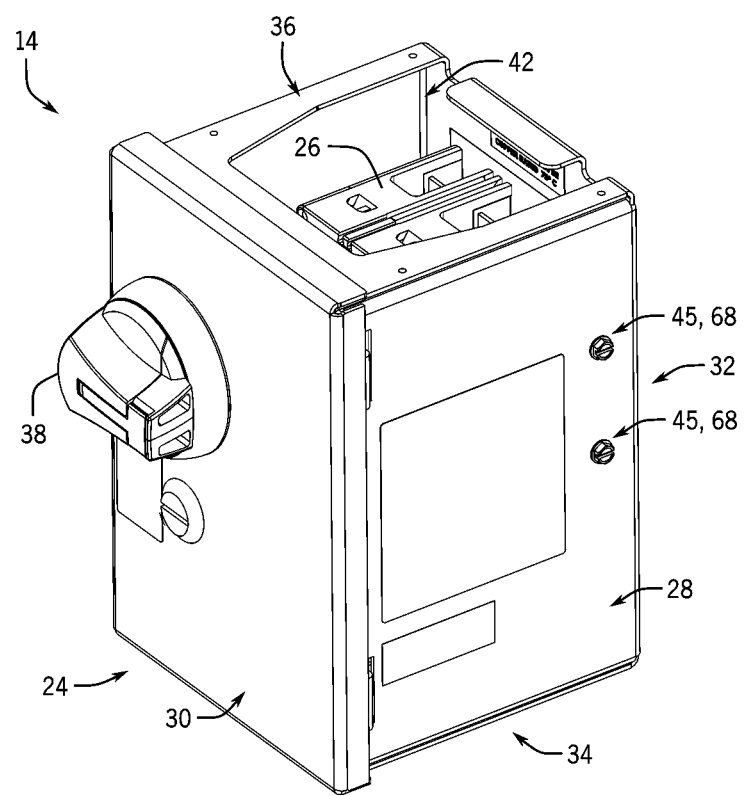
FIG. 4 is a perspective view of the branch protection device in isolation, according to an embodiment of the invention.

As shown in FIGS. 2, 3, and 4, branch protection device 14 includes a branch protection box or housing 24 that houses protection circuitry 26 therein. The branch protection box 24 generally includes side surfaces 28, front surface 30, back surface 32, bottom surface 34, and top surface 36. The front surface 30 includes a control feature 38 thereon, such as a knob or dial, that may be used to reset the branch protection device 14, such as resetting a circuit breaker after tripping thereof. The top surface 36 includes one of more openings 42 therein through which power supply cables or conduits 44 (generally see FIG. 1) may pass out from the branch protection device 14 and to VFD 16. Side surfaces 28 of branch protection box 24 each include a plurality of fastener holes 45 formed therein.

Figure 5:
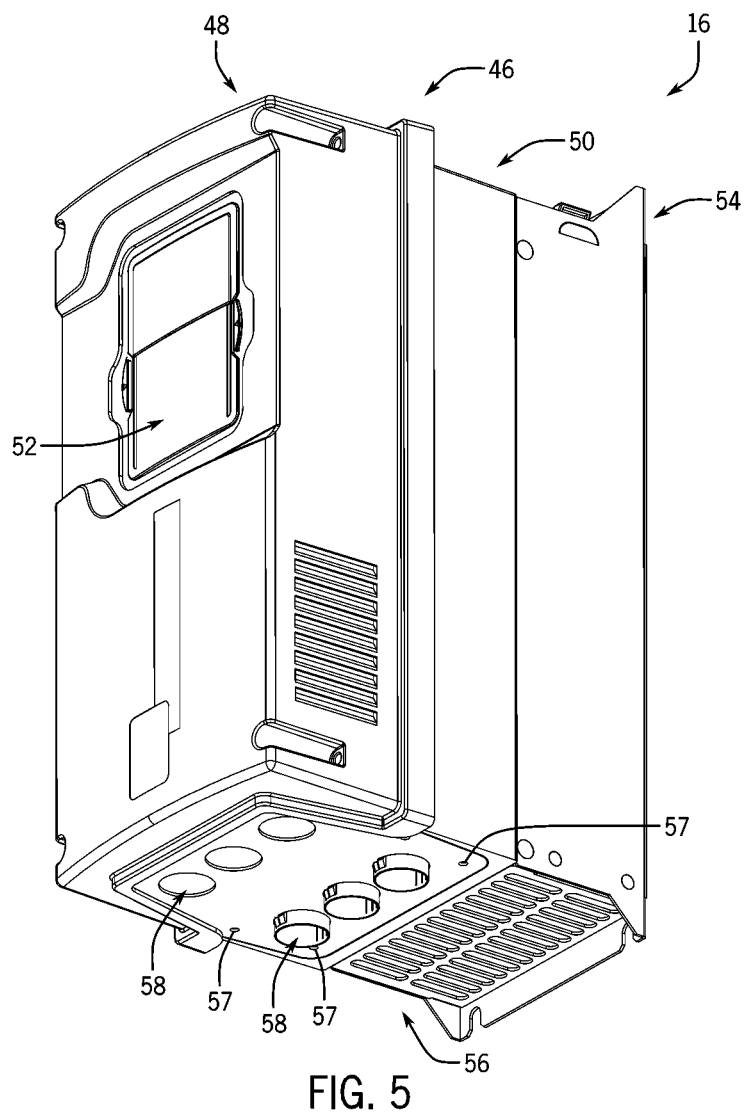
FIG. 5 is a perspective view of the variable frequency drive in isolation, according to an embodiment of the invention.

As shown in FIGS. 2, 3 and 5, VFD 16 includes an outer housing 46 that houses power conditioning circuitry 24 (FIG. 1) therein. The housing 46 of VFD 16 may generally include a front portion 48 and a rear portion 50. The front portion 48 comprises a control front panel 52 and the rear portion 50 comprises a back mounting surface 54 configured to provide for securing of the VFD 16 to a wall or other panel provided to support the VFD 16. The VFD housing 46 also includes a bottom surface 56 that includes a plurality of openings formed therein that comprise a plurality of fastener holes 57 as well as one or more openings 58 through which power supply cables or conduits 44 may pass into the VFD 16. According to an exemplary embodiment, an arrangement of six electrical conduit openings 58 are formed in bottom surface 56 of the VFD housing 46, so as to enable input and output of 3-phase power to/from the VFD 16.

Figure 6:
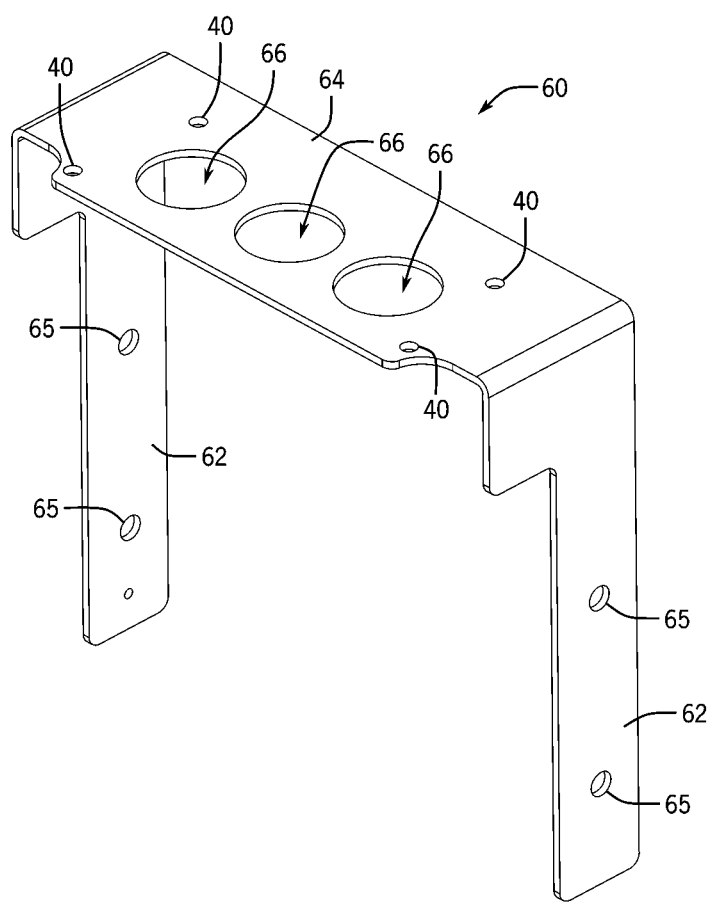
FIG. 6 is a perspective view of the mounting bracket that mounts the branch protection device to the variable frequency drive, according to an embodiment of the invention.

According to an exemplary embodiment, and as shown in FIGS. 3 and 6, a mounting bracket 60 is provided between the branch protection device 14 and VFD 16 that provides for mounting of the devices together. The mounting bracket 60 is constructed to have what may be characterized as a U-shaped structure, with a pair of side legs 62 spaced apart and extending down from a connecting leg 64. Each of the side legs 62 includes a plurality of fastener holes 65 formed therein whose number and spacing correspond to the fastener holes 45 formed in the side surfaces 28 of branch protection box 24, although in an exemplary embodiment fastener holes 65 are of a larger size than fastener holes 45 formed in the side surfaces 28 of branch protection box 24. According to an exemplary embodiment, two fastener holes 65 are formed in each of the side legs 62, although it is recognized that a greater or lesser number of fastener holes 65 could be provided. The connecting leg 64 also includes a plurality of fastener holes 40 formed therein whose number and spacing correspond to the fastener holes 57 formed in the bottom surface of VFD housing 46. Additionally, the connecting leg 64 includes one of more openings 66 formed therein through which power supply cables or conduits 44 may pass from the branch protection device 14 into the VFD 16. According to an exemplary embodiment, an arrangement of three electrical conduit openings 66 are formed in connecting leg 64 of the mounting bracket 60, so as to enable 3-phase supply power to be provided to the VFD 16.

To secure the branch protection device 14 to the VFD 16, the mounting bracket 60 is first positioned below and adjacent the VFD housing 46 such that fastener holes 40 on the connecting leg 64 of the mounting bracket 60 align with the fastener holes 57 on the bottom surface 56 of the VFD housing 46. Fasteners 67 are then inserted through the fastener holes 40 of mounting bracket 60 and passed through the fastener holes 57 of VFD housing 46 to secure the mounting bracket 60 to the VFD 16. Upon such alignment, openings 66 in connecting leg are aligned with at least a portion of openings 58 in bottom surface 56 of the VFD housing 46, so as to enable routing of power supply cables/conduits into the VFD 16, with additional openings in bottom surface 56 of the VFD housing 46 being left uncovered so as to provide for a routing of output power from the VFD 16 to a connected load 18. Upon securing of the mounting bracket 60 to the VFD 16, the branch protection box 24 is then slid up into mounting bracket 60 such that fastener holes 65 on the side legs 62 thereof align with the fastener holes 45 on the side surfaces 28 of the branch protection box 24. Fasteners 68 are then inserted through the fastener holes 65, 45 to secure the branch protection box 24 to the mounting bracket 60.

In mounting the branch protection device 14 directly to the VFD 16, it is recognized that the branch protection device 14 has a weight that may require modifications to be made to the VFD housing 46 beyond what a standard housing 46 would entail. Thus, according to an embodiment, the VFD housing 46 is modified such that the bottom surface 56 thereof is reinforced so as to be able to sufficiently bear a weight of the branch protection device 14. Such reinforcing of the bottom surface 56 may be achieved via a forming of the VFD housing 46 of a thicker gauge material or metal or via the use of additional brackets running from side surfaces 28 of the VFD housing 46 to the bottom surface 56.

Beneficially, embodiments of the invention thus provide a VFD and associated branch protection device integrated therewith that provides a reduced size/footprint of the overall arrangement and that minimizes the number of mounting brackets and fasteners required for mounting the devices. A separate back panel to which the VFD and associated branch protection device may be separately mounted is eliminated. The VFD and integrated branch protection device is cost competitive with existing systems/arrangements and is easy to assemble and install.

According to one embodiment of the present invention, a power protection and conditioning arrangement includes a variable frequency drive (VFD) having a VFD housing and a power conversion circuit contained within the VFD housing and operable to provide a controlled output power to a load. The power protection and conditioning arrangement also includes a branch protection device having a branch protection housing and a power protection circuit contained within the outer housing and operable to selectively interrupt current flow from a power source to the VFD during a fault condition. The branch protection device is coupled to the VFD, such that the branch protection device is integrated with the VFD.

According to another embodiment of the present invention, an integrated power protection and conditioning system includes a VFD operable to provide a controlled output power to a load and a branch protection device operable to selectively interrupt current flow from a power source to the VFD during a fault condition, wherein a branch protection box of the branch protection device is mounted directly to a housing of the VFD to integrate the branch protection device with the VFD According to yet another embodiment of the present invention, a method for providing an integrated power protection and conditioning system includes providing a branch protection device comprising a branch protection box enclosing branch protection circuitry operable to selectively interrupt current flow and mounting the branch protection device to a VFD comprising a housing enclosing power conversion circuitry operable to provide a controlled output power to a load, wherein mounting the branch protection device to the VFD comprises coupling the branch protection box to the housing, such that the branch protection device is integrated with the VFD.

The present invention has been described in terms of the preferred embodiment, and it is recognized that equivalents, alternatives, and modifications, aside from those expressly stated, are possible and within the scope of the appending claims.

What is claimed is:

1. A power protection and conditioning arrangement comprising:
   a variable frequency drive (VFD) comprising:
      a VFD housing; and
      a power conversion circuit contained within the VFD housing and operable to provide a controlled output power to a load;
   a branch protection device comprising:
      a branch protection housing; and
      a power protection circuit contained within the branch protection housing and operable to selectively interrupt current flow from a power source to the VFD during a fault condition; and
   a mounting bracket positioned between a bottom surface of the VFD housing and a top surface of the branch protection housing, the mounting bracket coupling the branch protection housing to the VFD housing such that the branch protection device is integrated with the VFD.

2. The power protection and conditioning arrangement of claim 1 wherein the mounting bracket comprises a U-shaped bracket including:
   a pair of side legs each including a plurality of fastener holes formed therein; and
   a connecting leg coupling the pair of side legs together, the connecting leg including a plurality of fastener holes and a plurality of electrical conduit holes formed therein.

3. The power protection and conditioning arrangement of claim 2 wherein the VFD housing includes a bottom surface comprising a plurality of fastener holes, and wherein a plurality of fasteners is positioned through the plurality of fastener holes in the bottom surface of the VFD housing and the connecting leg of the mounting bracket, respectively, to couple the mounting bracket to the VFD.

4. The power protection and conditioning arrangement of claim 3 wherein the branch protection housing includes side surfaces each comprising a plurality of fastener holes, and wherein a plurality of fasteners is positioned through the plurality of fastener holes in the side legs of the U-shaped bracket and in the side surfaces of the branch protection housing, respectively, to couple the U-shaped bracket to the branch protection housing.

5. The power protection and conditioning arrangement of claim 3 wherein the bottom surface of the VFD housing comprises a reinforced surface configured to bear a weight of the branch protection device.

6. The power protection and conditioning arrangement of 3 wherein each of the bottom surface of the VFD housing and a top surface of the branch protection housing includes a plurality of electrical conduit holes formed therein.

7. The power protection and conditioning arrangement of claim 6 further comprising a plurality of electrical conduits for routing power supply lines from the power source to the VFD, the plurality of electrical conduits being routed in from the branch protection device to the VFD housing through the plurality of electrical conduit holes formed in the top surface of the branch protection housing, connecting leg of the mounting bracket, and the bottom surface of the VFD housing, respectively.

8. The power protection and conditioning arrangement of claim 1 wherein the VFD housing includes a back surface comprising a plurality of wall mounts thereon, the mounts configured to mount the VFD housing directly to a wall without an intervening back panel.

9. The power protection and conditioning arrangement of claim 1 wherein the branch protection device comprises a circuit breaker or a disconnect.

10. An integrated power protection and conditioning system comprising:
   a variable frequency drive (VFD) operable to provide a controlled output power to a load;
   a branch protection device operable to selectively interrupt current flow from a power source to the VFD during a fault condition, the branch protection device comprising a branch protection box; and
   a mounting bracket positioned between a bottom surface of a housing of the VFD and the branch protection box to couple the branch protection box to the housing of the VFD, wherein the branch protection box is mounted directly to the housing of the VFD with the mounting bracket to integrate the branch protection device with the VFD.

11. The integrated power protection and conditioning system of claim 10 wherein the mounting bracket comprises a U-shaped bracket including:

a pair of side legs extending down along-side surfaces of the branch protection box and being coupled thereto via a plurality of fasteners; and a connecting leg positioned between the bottom surface of the housing and a top surface of the branch protection box and being coupled to the housing and the branch protection box via a plurality of fasteners.

12. The integrated power protection and conditioning system of claim 11 wherein each of the bottom surface of the housing, the top surface of the branch protection box, and the connecting leg includes a plurality of electrical conduit holes formed therein, with the plurality of electrical conduit holes in the bottom surface of the housing, the top surface of the branch protection box, and the connecting leg being aligned upon mounting of the branch protection box to the housing.

13. The integrated power protection and conditioning system of claim 11 wherein the bottom surface of the housing comprises a reinforced surface configured to bear a weight of the branch detection device.

14. The integrated power protection and conditioning system of claim 10 wherein the housing includes a back surface comprising a plurality of wall mounts thereon, the mounts configured to mount the VFD directly to a wall without an intervening back panel.

15. The integrated power protection and conditioning system of claim 10 wherein the branch protection device comprises a circuit breaker or a disconnect.

16. A method for providing an integrated power protection and conditioning system, the method comprising:

providing a branch protection device comprising a branch protection box enclosing branch protection circuitry operable to selectively interrupt current flow; and mounting the branch protection device to a variable frequency drive (VFD) comprising a housing enclosing power conversion circuitry operable to provide a controlled output power to a load;

wherein mounting the branch protection device to the VFD comprises coupling the branch protection box to the housing, such that the branch protection device is integrated with the VFD, and, wherein coupling the branch protection box to the housing comprises:

securing a mounting bracket to a bottom surface of the housing via a plurality of fasteners; and securing side surfaces of the branch protection box to the mounting bracket via a plurality of additional fasteners;

wherein the branch protection device is mounted to the VFD upon securing of the mounting bracket to the bottom surface of the housing and upon securing of the side surfaces of the branch protection box to the mounting bracket.

17. The method of claim 16 further comprising routing a plurality of electrical conduits in from the branch protection device to the VFD through a plurality of electrical conduit holes formed in the branch protection box, the mounting bracket, and the housing, respectively.

18. A system comprising:

an industrial control device comprising:
a device housing; and
a power conversion circuit in the device housing;

a branch protection device comprising:
a branch protection housing; and
a power protection circuit in the branch protection housing, the power protection circuit configured to interrupt current flow between a power source and the industrial control device during a fault condition; and a mounting bracket positioned between a bottom surface of the device housing and a top surface of the branch protection housing, the mounting bracket coupling the branch protection housing to the device housing such that the branch protection device is integrated with the industrial control device, wherein the mounting bracket comprises a U-shaped bracket, the U-shaped bracket comprising:

side legs each including a plurality of fastener holes; and a connecting leg coupling the pair of side legs together, the connecting leg including a plurality of fastener holes and a plurality of electrical conduit holes.

19. The system of claim 18, wherein the industrial control device is one or an adjustable speed drive and a variable speed drive.

* * * * *